(12) United States Patent
Suzuki et al.

(10) Patent No.: US 10,979,043 B2
(45) Date of Patent: Apr. 13, 2021

(54) SWITCHING ELEMENT CONTROL CIRCUIT AND POWER MODULE

(71) Applicant: SHINDENGEN ELECTRIC MANUFACTURING CO., LTD., Tokyo (JP)

(72) Inventors: Kenichi Suzuki, Saitama (JP); Wataru Miyazawa, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 16/647,524

(22) PCT Filed: Sep. 21, 2017

(86) PCT No.: PCT/JP2017/034179
§ 371 (c)(1),
(2) Date: May 26, 2020

(87) PCT Pub. No.: WO2019/058490
PCT Pub. Date: Mar. 28, 2019

(65) Prior Publication Data
US 2020/0287532 A1 Sep. 10, 2020

(51) Int. Cl.
*H03K 17/14* (2006.01)
*H02M 1/08* (2006.01)

(52) U.S. Cl.
CPC ............. *H03K 17/14* (2013.01); *H02M 1/08* (2013.01)

(58) Field of Classification Search
CPC .................................. H03K 17/14; H02M 1/08
See application file for complete search history.

(56) References Cited

U.S. PATENT DOCUMENTS 5,898,557 A * 4/1999 Baba ................... H03K 17/0822
361/100
8,243,407 B2 * 8/2012 Fukami .............. H03K 17/0822
361/78

(Continued)

FOREIGN PATENT DOCUMENTS

JP       2013-99181 A      5/2013
JP       2014-60594 A      4/2014
WO    2012/153459 A1    11/2012

OTHER PUBLICATIONS

International Search Report in PCT/JP2017/034179, dated Oct. 24, 2017. 4pp.

*Primary Examiner* — Thomas J. Hiltunen
(74) *Attorney, Agent, or Firm* — Hauptman Ham, LLP

(57) ABSTRACT

A switching element control circuit includes a third electrode voltage control part which controls a third electrode voltage; a temperature detection part which detects an operation temperature of the switching element; a memory part which stores an initial threshold voltage, an initial temperature when the initial threshold voltage is measured, and a temperature characteristic of a threshold voltage; and a threshold voltage calculation part which calculates a threshold voltage at the time of operating the switching element based on information including the operation temperature of the switching element, the initial threshold voltage, and an initial temperature when the initial threshold voltage is measured, and information relating to a temperature characteristic of a threshold voltage, wherein the third electrode voltage control part controls the third electrode voltage based on a threshold voltage at the time of operating the switching element calculated by the threshold voltage calculation part.

18 Claims, 9 Drawing Sheets

(56) References Cited

U.S. PATENT DOCUMENTS

| | | | |
|---|---|---|---|
| 8,680,897 B2* | 3/2014 | Itou | H03K 17/04126 |
| | | | 327/109 |
| 9,030,054 B2* | 5/2015 | Jacobson | H03K 17/14 |
| | | | 307/115 |
| 10,171,069 B1* | 1/2019 | Zoels | H03K 17/145 |
| 10,326,266 B2* | 6/2019 | Sugisawa | H02H 3/085 |
| 2012/0242376 A1* | 9/2012 | Ose | H03K 17/0828 |
| | | | 327/109 |
| 2013/0147525 A1 | 6/2013 | Takagiwa | |
| 2014/0077846 A1 | 3/2014 | Taguchi et al. | |
| 2016/0043713 A1* | 2/2016 | Okuda | H03K 17/567 |
| | | | 327/432 |
| 2019/0356161 A1* | 11/2019 | Wakazono | H03K 17/122 |

* cited by examiner

SWITCHING ELEMENT CONTROL CIRCUIT AND POWER MODULE

RELATED APPLICATIONS

The present application is a National Phase of International Application Number PCT/JP2017/034179, filed Sep. 21, 2017.

TECHNICAL FIELD

The present invention relates to a switching element control circuit and a power module.

BACKGROUND ART

Conventionally, there has been known a switching element control circuit which controls an ON/OFF operation of a switching element (see patent document 1, for example).

As shown in FIG. 10, a conventional switching element control circuit 900 includes a gate voltage control part 910 which controls a gate voltage for controlling an ON/OFF operation of a switching element 800.

According to the conventional switching element control circuit 900, an ON/OFF operation of the switching element 800 can be controlled by controlling a gate voltage.

PRIOR ART DOCUMENT

Patent Document

Patent document 1: WO/2012/153459

SUMMARY OF INVENTION

Problem to be Solved by the Invention

Recently, there has been a demand for a switching element control circuit capable of reducing a switching loss by increasing a switching speed. As one of methods for satisfying such a demand, a switching element control circuit is considered where a switching loss is reduced in such a manner that a turn-on period and a turn-off period are shortened by applying a gate voltage slightly exceeding a threshold voltage to a gate electrode thus increasing a switching speed (see FIGS. 4A and 4B).

However, a threshold voltage at the time of operating a switching element changes from an initial threshold voltage (for example, the threshold voltage at the time of shipping) due to a fact that an operation temperature of the switching element at the time of operating the switching element becomes higher than an initial temperature of the switching element when the initial threshold voltage is measured (see FIG. 3) and hence, there exists a drawback that it is difficult to shorten a turn-on period and a turn-off period by applying a voltage which slightly exceeds the threshold voltage at the time of operating the switching element to a gate electrode and to reduce a switching loss.

The present invention has been made to overcome the above-mentioned drawback, and it is an object of the present invention to provide a switching element control circuit capable of reducing a switching loss even when a threshold voltage at the time of operating a switching element changes from an initial threshold voltage. It is another object of the present invention to provide a power module provided with such a switching element control circuit.

Solution to Problem

[1] According to the present invention, there is provided a switching element control circuit for controlling an ON/OFF operation of a switching element which includes a first electrode, a second electrode, and a third electrode, the switching element control circuit comprising:

a third electrode voltage control part which controls a third electrode voltage for controlling the ON/OFF operation of the switching element;

a temperature detection part which detects an operation temperature of the switching element;

a memory part which stores information including an initial threshold voltage of the switching element and an initial temperature of the switching element when the initial threshold voltage is measured, and information relating to a temperature characteristic of a threshold voltage of the switching element; and a threshold voltage calculation part which calculates a threshold voltage at a time of operating the switching element based on information including the operation temperature of the switching element detected by the temperature detection part, the initial threshold voltage, and an initial temperature of the switching element when the initial threshold voltage is measured, and information relating to the temperature characteristic of a threshold voltage of the switching element, wherein the third electrode voltage control part controls the third electrode voltage based on the threshold voltage at the time of operating the switching element calculated by the threshold voltage calculation part at the time of bringing the switching element into an ON state.

[2] According to the present invention, it is preferable that the information relating to the temperature characteristic of the threshold voltage of the switching element be expressed by a characteristic formula which satisfies a relationship of $Vth=Vth_0-\alpha(T-T_0)$ assuming that a temperature coefficient of the threshold voltage of the switching element is $\alpha$, the threshold voltage at the time of operating the switching element is Vth, the initial threshold voltage is $Vth_0$, the operation temperature of the switching element detected by the temperature detection part is T, and the initial temperature of the switching element when the initial threshold voltage is measured is $T_0$.

[3] According to the present invention, it is preferable that the information including the initial threshold voltage and the initial temperature of the switching element when the initial threshold voltage is measured, and the information relating to the temperature characteristic of the threshold voltage of the switching element be stored in the memory part in advance.

[4] According to the present invention, it is preferable that the switching element control circuit be a switching element control circuit which performs an initial threshold voltage measurement mode where the initial threshold voltage of the switching element is measured, and a control mode where an ON/OFF operation of the switching element is controlled, the switching element control circuit further comprises:

a threshold voltage measurement power source which supplies a threshold voltage measurement current to the first electrode of the switching element;

a first electrode current detection part which detects a first electrode current which flows through the switching element; and an ON/OFF state determination part which determines an ON/OFF state of the switching element, and in the initial threshold voltage measurement mode, the third electrode voltage control part controls the third electrode voltage such that the third electrode voltage is increased in a stepwise manner, and the ON/OFF state determination part determines whether or not the switching element is turned on based on the first electrode current detected by the first electrode current detection part, and the memory part stores an operation temperature of the switching element and stores the third electrode voltage applied to the third electrode as the initial threshold voltage of the switching element when the ON/OFF state determination part determines that the switching element is brought into an ON state.

[5] According to the present invention, it is preferable that the switching element control circuit be a switching element control circuit which further performs a temperature characteristic measurement mode where a temperature characteristic of a threshold voltage of the switching element is measured after the control mode is performed for a predetermined time, the switching element control circuit further comprises a temperature characteristic calculation part which calculates a temperature characteristic of a threshold voltage of the switching element, and in the temperature characteristic measurement mode, the third electrode voltage control part controls the third electrode voltage such that the third electrode voltage is increased in a stepwise manner, the ON/OFF state determination part determines whether or not the switching element is turned on based on the first electrode current detected by the first electrode current detection part, the memory part stores an operation temperature of the switching element and to store the third electrode voltage applied to the third electrode as a temperature characteristic measurement time threshold voltage of the switching element when the ON/OFF state determination part determines that the switching element is brought into an ON state, and the temperature characteristic calculation part calculates the temperature characteristic of the threshold voltage of the switching element based on the information including the initial threshold voltage, the initial temperature of the switching element when the initial threshold voltage is measured, the operation temperature of the switching element detected by the temperature detection part in the temperature characteristic measurement mode, and the temperature characteristic measurement time threshold voltage.

[6] According to the present invention, it is preferable that the third electrode voltage control part control the third electrode voltage such that the third electrode voltage is increased in a stepwise manner along with a lapse of time in the initial threshold voltage measurement mode.

[7] According to the present invention, it is preferable that the third electrode voltage control part control the third electrode voltage such that the third electrode voltage becomes a pulse-like voltage which is a pulse increasing an amplitude along with a lapse of time in the initial threshold voltage measurement mode.

[8] According to the present invention, it is preferable that the switching element control circuit be a switching element control circuit which performs a temperature characteristic measurement mode where the temperature characteristic of the threshold voltage of the switching element is measured after a control mode where an ON/OFF operation of the switching element is controlled is performed for a predetermined time, the switching element control circuit further comprises:

a threshold voltage measurement power source which supplies a threshold voltage measurement current to the first electrode of the switching element;

a first electrode current detection part which detects a first electrode current which flows through the switching element;

an ON/OFF state determination part which determines an ON/OFF state of the switching element; and a temperature characteristic calculation part which calculates a temperature characteristic of a threshold voltage of the switching element, and in the temperature characteristic measurement mode, the third electrode voltage control part controls the third electrode voltage such that the third electrode voltage is increased in a stepwise manner, the ON/OFF state determination part determines whether or not the switching element is turned on based on the first electrode current detected by the first electrode current detection part, the memory part stores the third electrode voltage applied to the third electrode as a temperature characteristic measurement time threshold voltage of the switching element when the ON/OFF state determination part determines that the switching element is brought into an ON state, and the temperature characteristic calculation part calculates the temperature characteristic of a threshold voltage of the switching element based on the information including the initial threshold voltage, the initial temperature of the switching element when the initial threshold voltage is measured, the operation temperature of the switching element detected by the temperature detection part in the temperature characteristic measurement mode, and the temperature characteristic measurement time threshold voltage.

[9] According to the present invention, it is preferable that the third electrode voltage control part control the third electrode voltage such that the third electrode voltage is increased in a stepwise manner along with a lapse of time in the temperature characteristic measurement mode.

[10] According to the present invention, it is preferable that the third electrode voltage control part control the third electrode voltage such that the third electrode voltage becomes a pulse-like voltage which is a pulse increasing an amplitude along with a lapse of time in the temperature characteristic measurement mode.

[11] According to the present invention, it is preferable that the information relating to the temperature characteristic of the threshold voltage of the switching element be data indicating a relationship of temperature-threshold voltage stored in the memory part in advance.

[12] According to the present invention, it is preferable that the switching element is a MOSFET, IGBT or a HEMT.

[13] According to the present invention, it is preferable that the switching element be formed using a material which contains GaN, SiC or $Ga_2O_3$.

[14] According to the present invention, there is provided a power module which includes: a switching element provided with a first electrode, a second electrode, and a third electrode; and the switching element control circuit described in anyone of [1] to [13] which controls an ON/OFF operation of the switching element.

Advantageous Effects of Invention

According to the switching element control circuit and the power module of the present invention, the threshold voltage calculation part calculates a threshold voltage at the time of operating the switching element based on the information including an operation temperature of the switching element detected by the temperature detection part, and the gate voltage control part, when the switching element is brought into an ON state, controls a gate voltage based on the threshold voltage at the time of operating the switching element calculated by the threshold voltage calculation part. Accordingly, even when the threshold voltage at the time of operating the switching element changes from an initial threshold voltage due to the increase of an operation temperature of the switching element at the time of operating the switching element exceeding an initial temperature of the switching element when the initial threshold voltage is measured, it is possible to apply a voltage which slightly exceeds the threshold voltage at the time of operating the switching element to the gate electrode. Accordingly, a turn-on period and a turn-off period can be shortened. As a result, a switching loss can be reduced.

BRIEF DESCRIPTION OF DRAWINGS

FIG. 4A is a schematic view of a graph showing a change with time of a gate-source voltage when a gate voltage is applied to a gate electrode in a switching element control circuit according to a comparison example, and FIG. 4B is a schematic view of a graph showing a change with time of a gate-source voltage when a gate voltage which slightly exceeds a threshold voltage is applied to a gate electrode in the switching element control circuit 100 according to the embodiment 1.

DESCRIPTION OF EMBODIMENTS

Hereinafter, a switching element control circuit and a power module according to the present invention are described based on embodiments shown in drawings. The respective drawings are schematic views, and do not always strictly reflect the actual circuit configuration and actual graphs.

Embodiment 1

1. Configuration of power module 1 and switching element control circuit 100 according to embodiment 1

Figure 1:
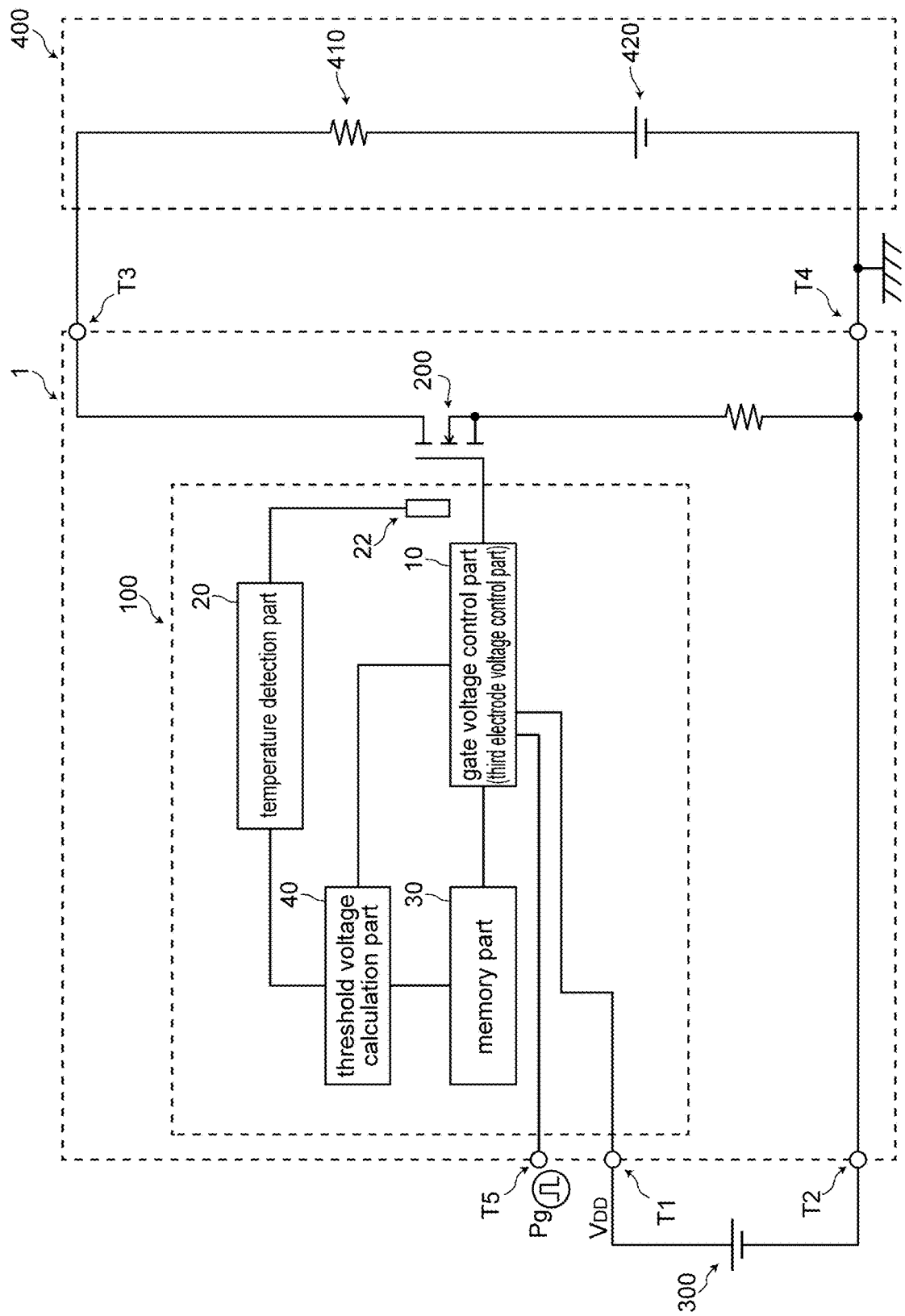
FIG. 1 is a circuit diagram showing a power module 1 and a switching element control circuit 100 according to an embodiment 1.
Figure 2:
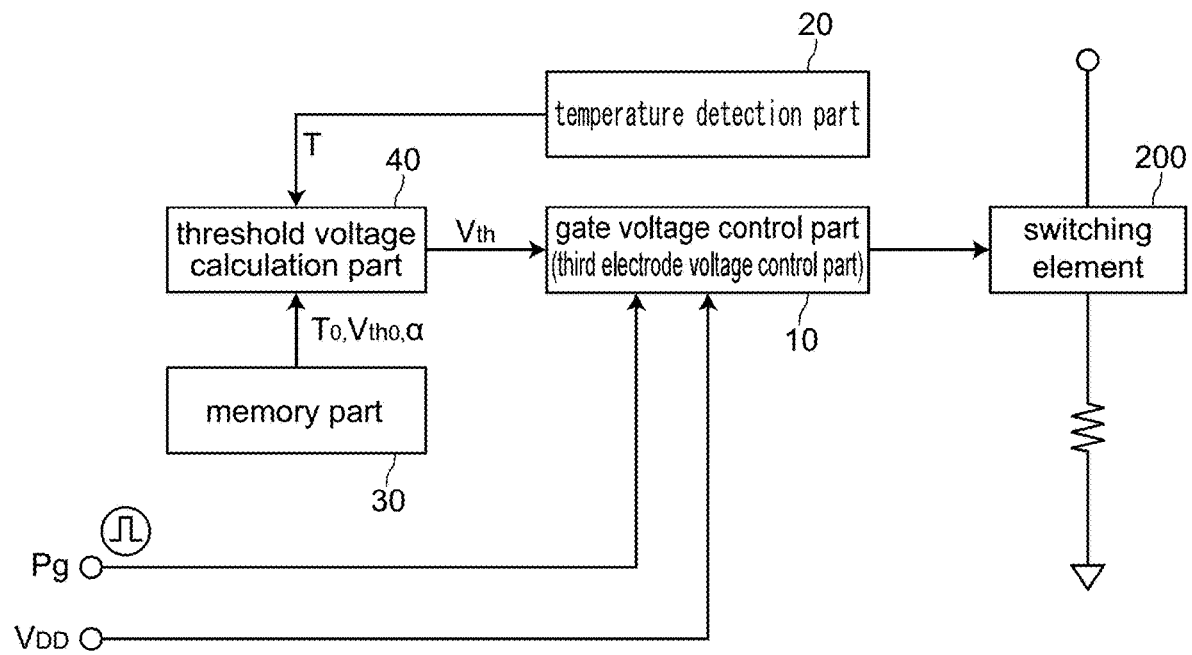
FIG. 2 is a block diagram for explaining the switching element control circuit 100 according to the embodiment 1.

As shown in FIG. 1, a power module 1 according to the embodiment 1 includes: a switching element 200; and a switching element control circuit 100 according to the embodiment 1 which controls an ON/OFF operation of the switching element 200. The power module 1 according to the embodiment 1 is covered by a package formed using a resin, ceramic or the like having high heat resistance and high insulation property. The power module 1 according to the embodiment 1 includes: a (+) side input terminal T1 to which a DC power source voltage $V_{DD}$ is inputted; a (−) side input terminal T2 on a ground side, a (+) side output terminal T3; a (−) side output terminal T4 on the ground side; and a control terminal T5 to which a drive signal (for example, a gate pulse) Pg is inputted.

A gate drive power source 300 for applying a power source voltage $V_{DD}$ is connected between the (+) side input terminal T1 and the (−) side input terminal T2. The gate drive power source 300 is connected to a gate electrode of a switching element 200 via a gate voltage control part 10, and supplies a voltage to the gate electrode. A load circuit 400 is connected to the (+) side output terminal T3 and the (−) side output terminal T4. The load circuit 400 includes, for example, a load resistor 410 and a DC drive power source 420. The load resistor 410 and the DC drive power source 420 are connected in series between the (+) side output terminal T3 and the (−) side output terminal T4. The (−) side output terminal T4 is grounded.

The switching element 200 is a MOSFET which includes a source electrode (second electrode), a drain electrode (first electrode), and a gate electrode (third electrode). The switching element 200 is brought into an ON state when a gate voltage (third electrode voltage) which exceeds a threshold voltage is applied to the gate electrode, and is brought into an OFF state when the gate voltage becomes lower than the threshold voltage. The gate voltage is supplied from the power source voltage $V_{DD}$, and is controlled by the gate voltage control part 10 (third electrode voltage control part) described later. Although a MOSFET is used as the switching element 200 in the embodiment 1, a suitable switching element can be used as the switching element 200. The switching element 200 is formed using a material which contains GaN. When the switching element 200 contains GaN, a difference between an absolute maximum rated voltage and a threshold voltage of the gate electrode becomes small.

A drain electrode of the switching element 200 is connected to the load circuit 400 via the (+) side output terminal T3. The gate electrode of the switching element 200 is connected to the gate voltage control part 10. The source electrode of the switching element 200 is connected to the (−) side output terminal T4 via a resistor.

The switching element control circuit 100 according to the embodiment 1 includes the gate voltage control part 10 (third electrode voltage control part), a temperature detection part 20, a memory part 30, and a threshold voltage calculation part 40 (see FIG. 1).

The gate voltage control part 10 is connected to the threshold voltage calculation part 40 and the memory part 30. The gate voltage control part 10 controls a gate voltage for controlling ON/OFF of the switching element 200 based on an inputted drive signal (for example, a gate pulse) Pg.

The temperature detection part 20 has a temperature detection element 22, and is connected to the threshold voltage calculation part 40. A suitable temperature detection element such as a diode or a thermistor can be used as the temperature detection element 22.

The memory part 30 is connected to the gate voltage control part 10 and the threshold voltage calculation part 40. In the memory part 30, information on an initial threshold voltage $Vth_0$ of the switching element 200 (a lower limit voltage of a threshold voltage of the in-use switching element 200 set in advance) and an initial temperature $T_0$ of the switching element 200 when the initial threshold voltage $Vth_0$ is measured (an initial threshold voltage measurement temperature set in advance), and information relating to a temperature characteristic of a threshold voltage of the switching element 200 are stored in advance. Accordingly, it is unnecessary to measure the initial threshold voltage $Vth_0$ and the initial temperature $T_0$ after the switching element 200 is assembled to the switching element control circuit 100.

Figure 3:
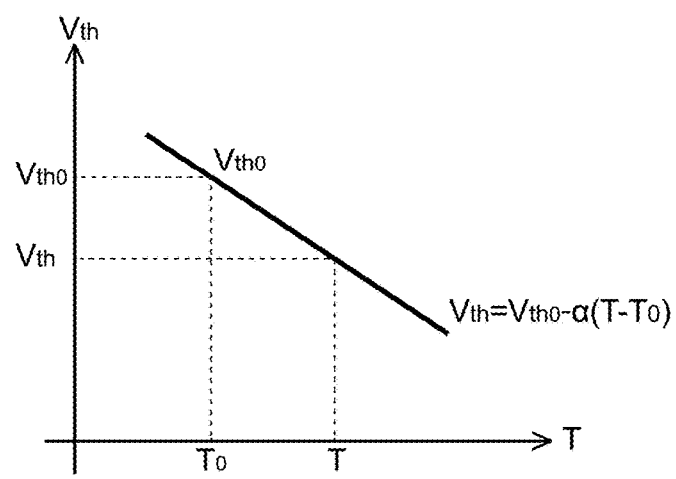
FIG. 3 is a schematic graph showing a relationship between a threshold voltage Vth and an operation temperature T of a switching element.

The information relating to the temperature characteristic of the threshold voltage of the switching element 200 is expressed by a characteristic formula which satisfies a relationship of $Vth=Vth_0-\alpha(T-T_0)$ assuming that a temperature coefficient of the threshold voltage of the switching element 200 is $\alpha$, the threshold voltage at the time of operating the switching element 200 is Vth, the initial threshold voltage is $Vth_0$, an operation temperature of the switching element 200 detected by the temperature detection part 20 is T, and an initial temperature of the switching element 200 when the initial threshold voltage $Vth_0$ is measured is $T_0$ (see FIG. 3). That is, the relationship between the threshold voltage Vth and the operation temperature T of the switching element 200 forms a linear function with a negative slope.

When the switching element 200 is brought into an ON state, a gate voltage applied to the gate electrode is decided as follows.

First, the temperature detection part 20 detects an operation temperature T of the switching element 200 via the temperature detection element 22.

The threshold voltage calculation part 40 reads information including an initial threshold voltage $Vth_0$ of the switching element 200 and an initial temperature $T_0$ of the switching element 200 when the initial threshold voltage $Vth_0$ is measured, and information relating to a temperature characteristic of the threshold voltage of the switching element 200 from the memory part 30. The threshold voltage calculation part 40 also reads the operation temperature T of the switching element 200 from the temperature detection part 20. Then, the threshold voltage calculation part 40 calculates a threshold voltage Vth at the time of operating the switching element 200 by putting these information and the operation temperature T into the characteristic formula of $Vth=Vth_0-\alpha(T-T_0)$.

Figure 4A:
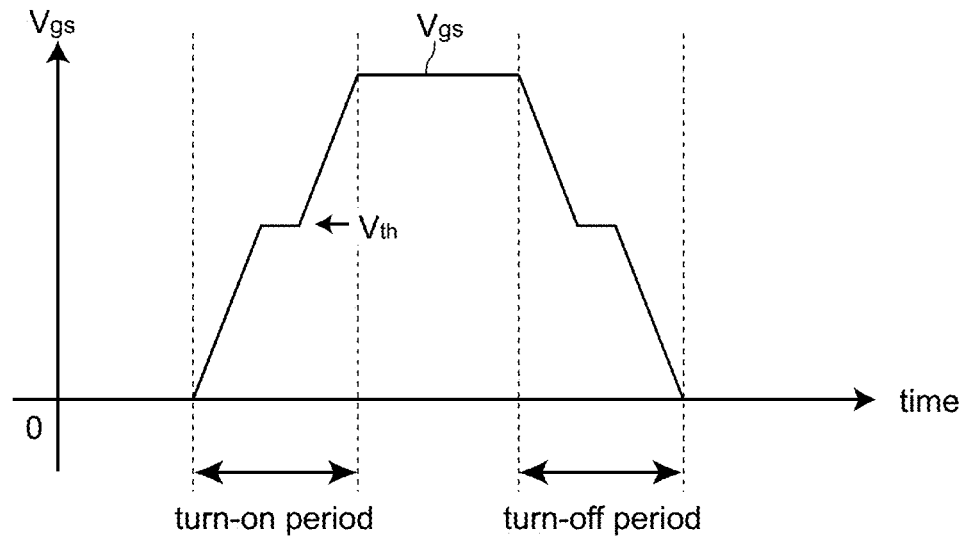
FIG. 4A and FIG. 4B are views for explaining effects when a gate voltage which slightly exceeds a threshold voltage is applied to a gate electrode.
Figure 4B:
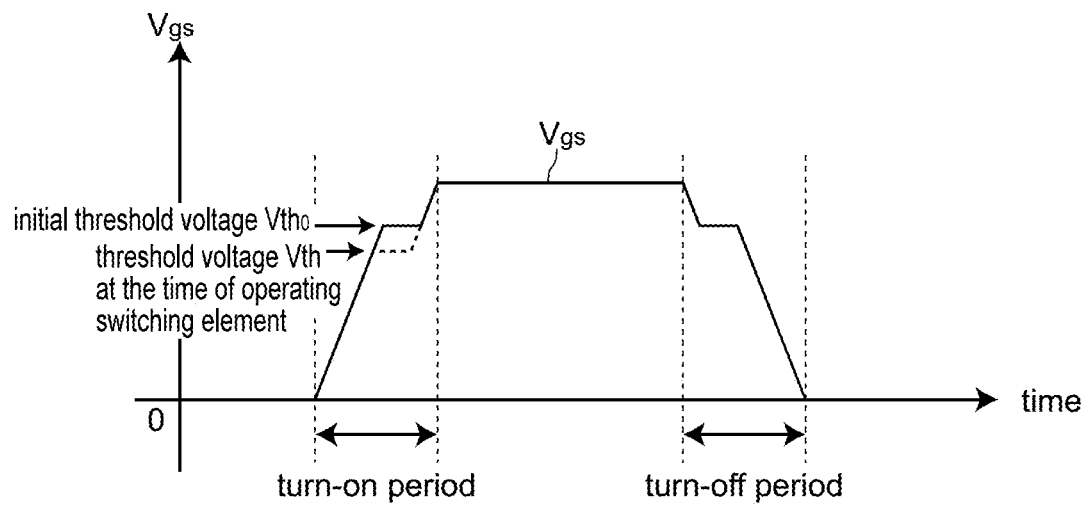

Next, the gate voltage control part 10 applies a gate voltage which slightly exceeds the threshold voltage Vth to the gate electrode based on the threshold voltage Vth at the time of operating the switching element 200 calculated by the threshold voltage calculation part 40 (see FIG. 4B). In this manner, a gate voltage applied to the gate electrode is decided.

In the switching element control circuit 100 according to the embodiment 1, a gate voltage may be constantly controlled in accordance with a temperature of the switching element 200. Alternatively, an operation temperature of the switching element 200 may be detected every predetermined time, a threshold voltage at the time of operating the switching element 200 may be calculated, and a gate voltage may be controlled based on the threshold voltage at the time of operating the switching element 200.

2. Advantageous effects acquired by switching element control circuit 100 and power module 1 according to embodiment 1

According to the switching element control circuit 100 and the power module 1 of the embodiment 1, the threshold voltage calculation part 40 calculates a threshold voltage Vth at the time of operating the switching element 200 based on information including an operation temperature T of the switching element 200 detected by the temperature detection part 20, and when the switching element 200 is brought into an ON state, the gate voltage control part 10 controls a gate voltage based on the threshold voltage Vth at the time of operating the switching element 200 calculated by the threshold voltage calculation part 40. Accordingly, even when the threshold voltage Vth at the time of operating the switching element 200 changes from an initial threshold voltage $Vth_0$ due to the increase of an operation temperature T of the switching element 200 at the time of operating the switching element 200 exceeding an initial temperature $T_0$ of the switching element 200 when the initial threshold voltage $Vth_0$ is measured, it is possible to apply a voltage which slightly exceeds the threshold voltage Vth at the time of operating the switching element 200 to the gate electrode. Accordingly, a turn-on period and a turn-off period can be shortened. As a result, a switching loss can be reduced.

According to the switching element control circuit 100 of the embodiment 1, the information relating to the temperature characteristic of the threshold voltage of the switching element is expressed by a characteristic formula which satisfies a relationship of $Vth=Vth_0-\alpha(T-T_0)$ assuming that a temperature coefficient of the threshold voltage of the switching element is $\alpha$, the threshold voltage at the time of operating the switching element 200 is Vth, the initial threshold voltage is $Vth_0$, an operation temperature of the switching element detected by the temperature detection part is T, and an initial temperature of the switching element when the initial threshold voltage is measured is $T_0$. Accordingly, a threshold voltage Vth at the time of operating the switching element 200 can be relatively easily calculated.

According to the switching element control circuit 100 of the embodiment 1, even when a difference between an absolute maximum rated voltage and a threshold voltage is small as in the case of the switching element formed using a material which contains GaN, a voltage which slightly exceeds a threshold voltage Vth at the time of operating the switching element can be applied to the gate electrode. Accordingly, a turn-on period and a turn-off period can be shortened. As a result, a switching loss can be reduced. Further, it is possible to prevent the occurrence of a phenomenon where the switching element 200 is not brought into an ON state even when a gate voltage which slightly exceeds a threshold voltage (a threshold voltage on design) is applied to the gate electrode. As a result, an ON/OFF operation of the switching element 200 can be controlled with certainty.

Further, according to the power module 1 of the embodiment 1, the switching element 200 is formed using a material which contains GaN. Accordingly, an ON resistance of the switching element 200 is lowered and hence, it is possible to provide a power module which exhibits a small conduction loss.

Embodiment 2

A switching element control circuit 102 according to the embodiment 2 has basically substantially the same configuration as the switching element control circuit 100 according to the embodiment 1. However, the switching element control circuit 102 according to the embodiment 2 differs from the switching element control circuit 100 according to the embodiment 1 with respect to a point that the switching element control circuit 102 further includes a threshold voltage measurement power source, a drain current detection part, and an ON/OFF state determination part. That is, the switching element control circuit 102 according to the embodiment 2 is a switching element control circuit which changes a mode between an initial threshold voltage measurement mode where an initial threshold voltage $Vth_0$ of a switching element 200 is measured and a control mode where an ON/OFF operation of the switching element 200 is controlled (see FIG. 5).

A threshold voltage measurement power source 50 is connected to a drain electrode of the switching element 200. In the initial threshold voltage measurement mode, the threshold voltage measurement power source 50 supplies an electric current for a threshold voltage measurement to a drain electrode (first electrode) of the switching element 200 by turning on a threshold voltage measurement switch 52.

As the threshold voltage measurement switch 52, a suitable switch can be used. For example, a photocoupler can be used.

A drain current detection part (first electrode current detection part) 60 is connected to a source electrode of the switching element 200. In the initial threshold voltage measurement mode, the drain current detection part 60 detects a drain current (first electrode current, source current) Id of the switching element 200. Further, the drain current detection part 60 is connected to an ON/OFF state determination part 70 described later. The drain current detection part 60 performs measurement by voltage conversion by supplying an electric current to a resistor connected to the source electrode of the switching element 200. However, a suitable detection device may be adopted as the drain current detection part 60.

In the initial threshold voltage measurement mode, the ON/OFF state determination part 70 determines an ON/OFF state of the switching element 200 based on a detection result received from the drain current detection part 60. The ON/OFF state determination part 70 is connected to the drain current detection part 60 and a gate voltage control part 10.

A memory part 30 is connected not only to a gate voltage control part 10 and a threshold voltage calculation part 40 but also to a temperature detection part 20.

The switching element control circuit 102 according to the embodiment 2 is operated as follows.

(1) Initial Threshold Voltage Measurement Mode

The initial threshold voltage measurement mode is a mode where an initial threshold voltage $Vth_0$ of the switching element 200 connected to the switching element control circuit 100 is measured. This mode is performed before the switching element control circuit 102 and the switching element 200 are driven.

Figure 5:
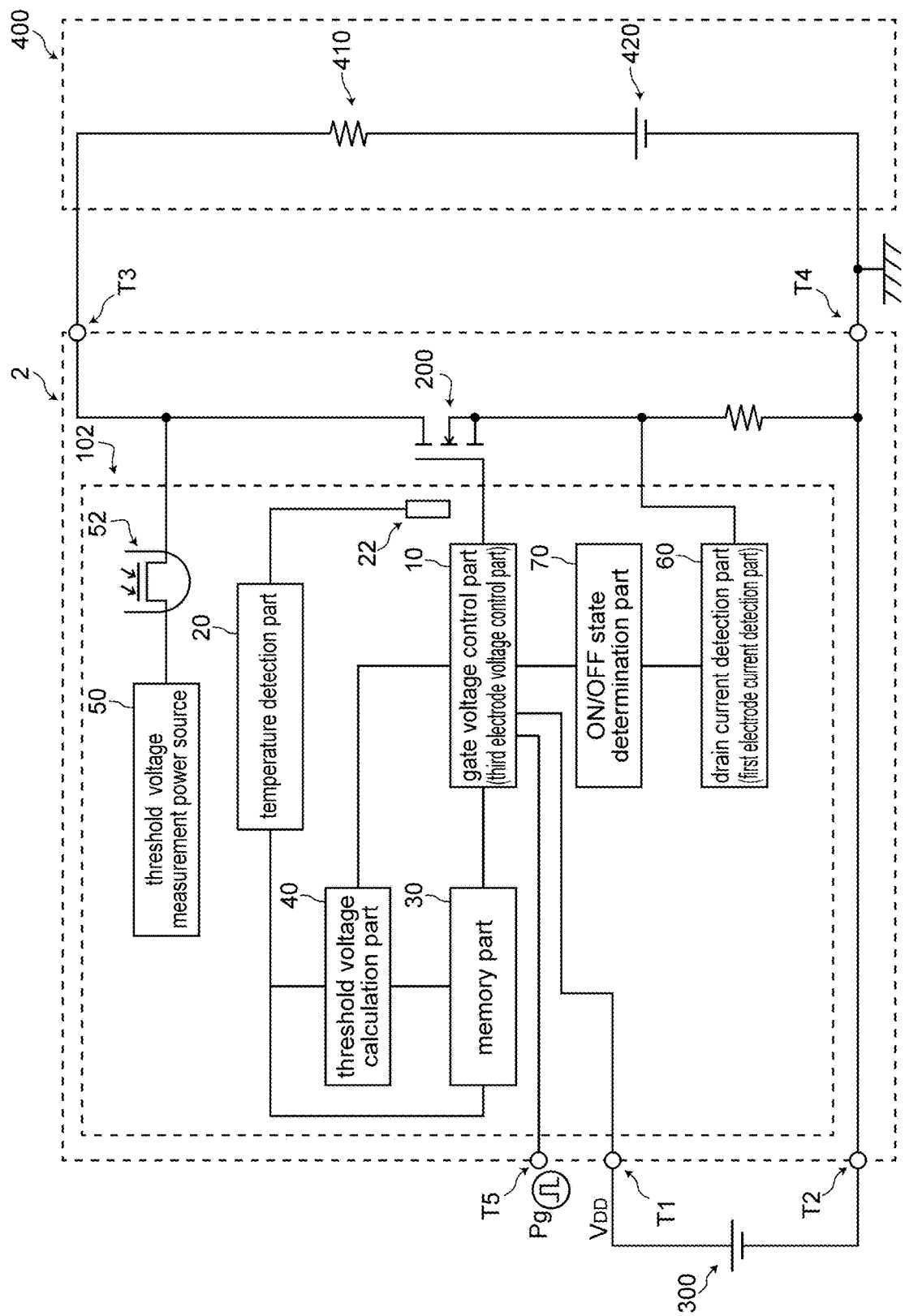
FIG. 5 is a circuit diagram showing a power module 2 and a switching element control circuit 102 according to an embodiment 2.
Figure 6:
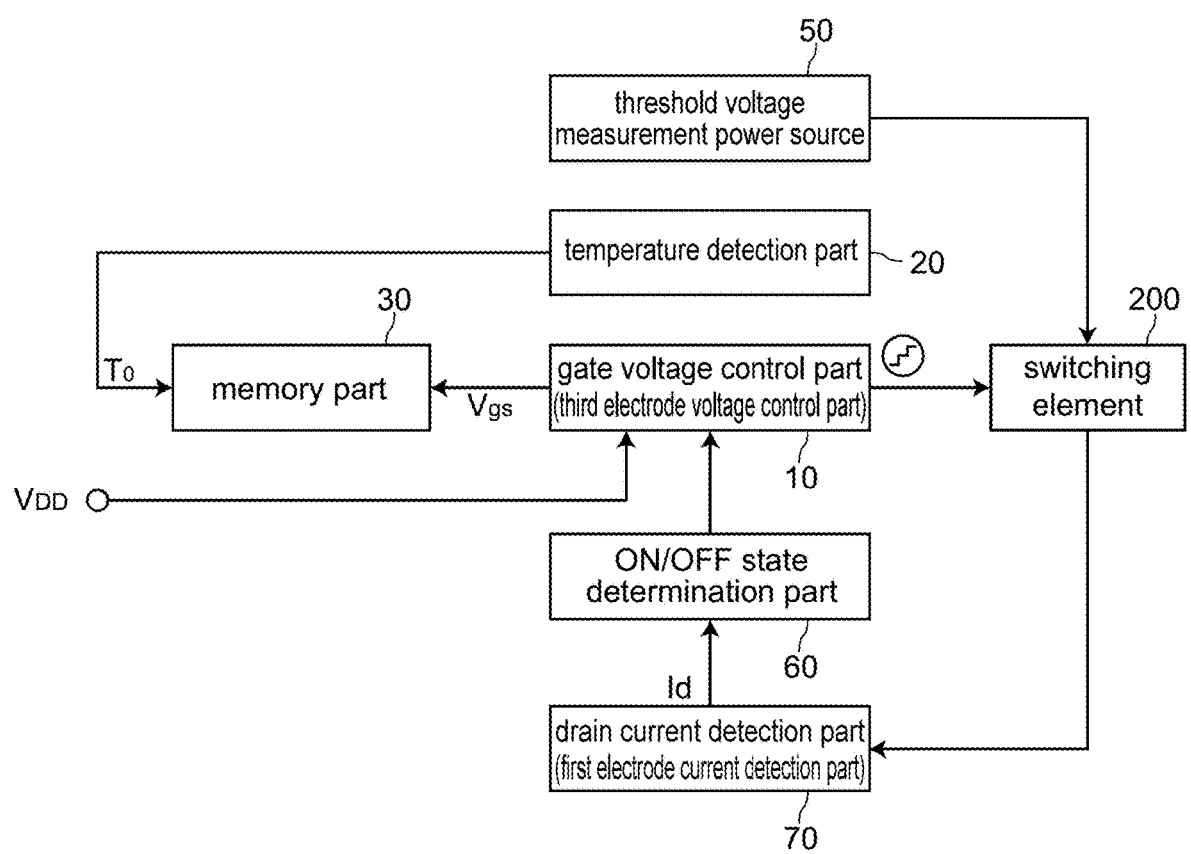
FIG. 6 is a block diagram for explaining an initial threshold voltage measurement mode of the switching element control circuit 102 according to the embodiment 2.

First, in a state where an electric current is not supplied from a drive power source 420, an electric current for the threshold voltage measurement is supplied to the drain electrode of the switching element 200 from the threshold voltage measurement power source 50 (see FIG. 5 and FIG. 6).

Figure 7:
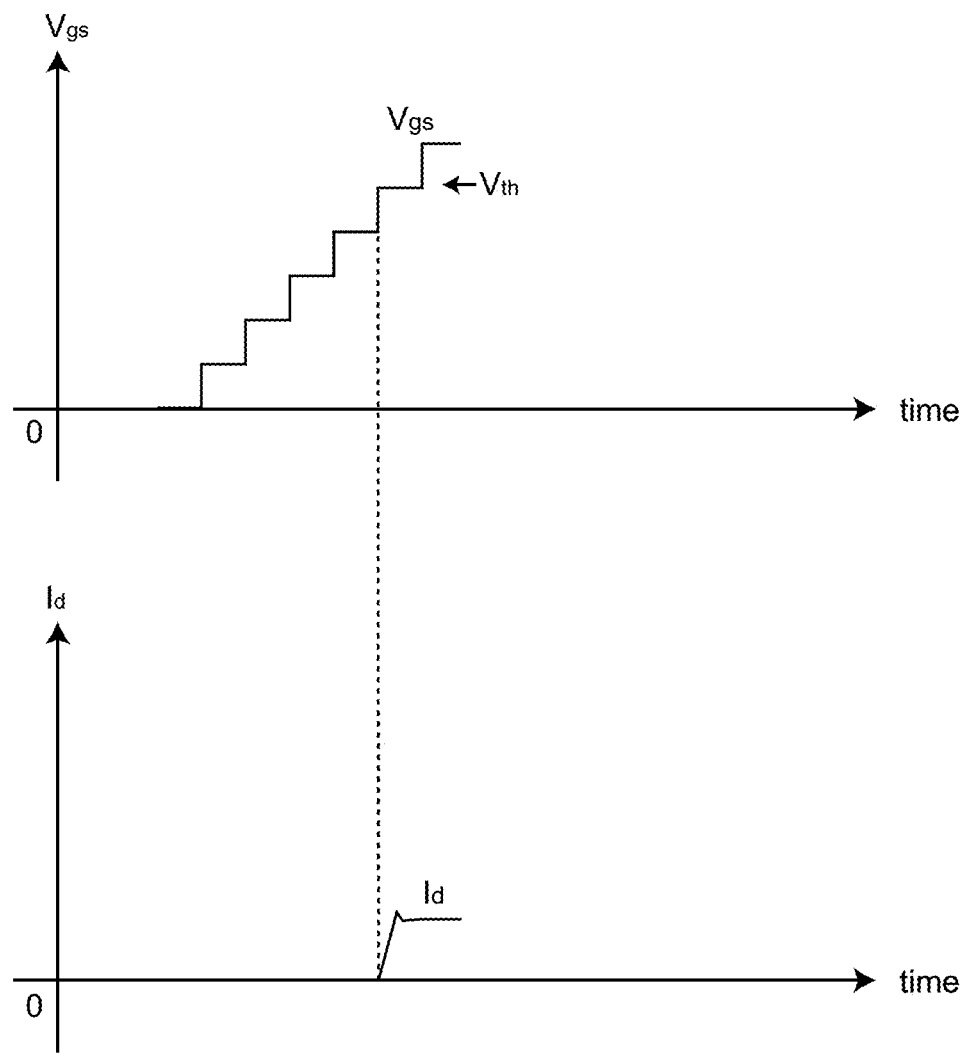
FIG. 7 is a schematic graph for explaining the initial threshold voltage measurement mode in the second embodiment.

Next, the gate voltage control part 10 controls a gate voltage such that a voltage lower than an estimated initial threshold voltage is applied to the gate electrode. At this stage of operation, a drain current is not detected by the drain current detection part 60 (a value of the drain current being 0) and hence, the ON/OFF state determination part 70 determines that the switching element 200 is in an OFF state. When the ON/OFF state determination part 70 determines that the switching element 200 is in an OFF state, the gate voltage control part 10 controls the gate voltage such that the gate voltage is increased by one stage (see FIG. 7).

The gate voltage is increased in a stepwise manner (to be more specific, increased in a step-like manner) by repeating such an operation. When a drain current is detected by the drain current detection part 60 (when the drain current takes a value other than 0), the ON/OFF state determination part 70 determines that the switching element 200 is in an ON state. At this stage of operation, an operation temperature of the switching element 200 detected by the temperature detection part 20 is transmitted to the memory part 30 as an initial temperature $T_0$, and the gate voltage control part 10 transmits a gate voltage Vgs applied to the gate electrode to the memory part 30 as an initial threshold voltage $Vth_0$. Then, the gate voltage Vgs is stored in the memory part 30 as an initial threshold voltage $Vth_0$.

(2) Control Mode

In the control mode, when the switching element is brought into an ON state, the threshold voltage calculation part 40 calculates a threshold voltage Vth at the time of operating the switching element based on an initial threshold voltage $Vth_0$ measured in the initial threshold voltage measurement mode, an initial temperature $T_0$ of the switching element 200, an operation temperature T of the switching element 200 detected by the temperature detection part 20, and information (a temperature coefficient α) relating to a temperature characteristic of a threshold voltage of the switching element stored in the memory part 30 in advance (by putting these values to the characteristic formula $Vth=Vth_0-\alpha(T-T_0)$. The gate voltage control part 10 applies a gate voltage which slightly exceeds a threshold voltage Vth at the time of operating the switching element 200 which is calculated by the threshold voltage calculation part 40 to the gate electrode (see FIG. 4B).

In this manner, the switching element control circuit 102 according to the embodiment 2 differs from the case of the switching element control circuit 100 according to the embodiment 1 with respect to the point that the switching element control circuit 102 further includes the threshold voltage measurement power source, the drain current detection part, and the ON/OFF state determination part. However, in the same manner as the switching element control circuit 100 according to the embodiment 1, the threshold voltage calculation part 40 calculates a threshold voltage Vth at the time of operating the switching element 200 based on information including an operation temperature T of the switching element 200 detected by the temperature detection part 20, and the gate voltage control part 10 controls a gate voltage based on the threshold voltage Vth at the time of operating the switching element 200 calculated by the threshold voltage calculation part 40 when the switching element 200 is brought into an ON state. Accordingly, even when the threshold voltage Vth at the time of operating the switching element 200 changes from an initial threshold voltage $Vth_0$ due to the increase of an operation temperature T of the switching element 200 at the time of operating the switching element 200 exceeding an initial temperature $T_0$ of the switching element 200 when the initial threshold voltage $Vth_0$ is measured, it is possible to apply a voltage which slightly exceeds the threshold voltage Vth at the time of operating the switching element 200 to the gate electrode. Accordingly, a turn-on period and a turn-off period can be shortened. As a result, a switching loss can be reduced.

Further, according to the switching element control circuit 102 and a power module 2 according to the embodiment 2, in an initial threshold voltage measurement mode, an actual threshold voltage of the switching element 200 which is actually connected to the switching element control circuit 102 can be measured. Accordingly, even in the case where an actual threshold voltage changes from a threshold voltage on design due to irregularities in manufacture of the switching element 200, when the switching element 200 is brought into an ON state, it is possible to apply a gate voltage which slightly exceeds an actual threshold voltage to the gate electrode of the switching element 200 based on the actual threshold voltage. Accordingly, compared to a case where a gate voltage which largely exceeds a threshold voltage is applied to a gate electrode of the switching element 200 for controlling an ON/OFF operation of the switching element 200 with certainty (comparison example. See FIG. 4A), a turn-on period and a turn-off period can be shortened in this embodiment 2. Accordingly, a switching speed of the switching element 200 can be increased. As a result, a switching loss of the switching element 200 can be reduced.

Further, according to the switching element control circuit 102 and the power module 2 of the embodiment 2, as described previously, when the switching element 200 is brought into an ON state, a gate voltage which slightly exceeds an actual threshold voltage can be applied to the gate electrode based on the actual threshold voltage. Accordingly, even in the case where an actual threshold voltage changes such that the actual threshold voltage becomes higher than a threshold voltage on design due to irregularities in manufacture of the switching element 200, it is possible to apply a gate voltage which slightly exceeds an actual threshold voltage to the gate electrode. Accordingly, it is possible to prevent the occurrence of a phenomenon where the switching element 200 is not brought into an ON state even when the gate voltage which slightly exceeds a threshold voltage (threshold voltage on design) is applied to the gate electrode. As a result, an ON/OFF operation of the switching element 200 can be controlled with certainty.

Particularly, even in the case where a difference between an absolute maximum rated voltage of the gate electrode and a threshold voltage is small as in the case where the switching element 200 is formed using a material which contains GaN, a gate voltage which slightly exceeds an actual threshold voltage can be applied to the gate electrode. Accordingly, it is possible to prevent the occurrence of a phenomenon where the switching element 200 is not brought into an ON state even when the gate voltage which slightly exceeds a threshold voltage (threshold voltage on design) is applied to the gate electrode. As a result, an ON/OFF operation of the switching element 200 can be controlled with certainty.

Further, according to the switching element control circuit 102 and the power module 2 of the embodiment 2, in an initial threshold voltage measurement mode, an actual threshold voltage can be measured, and in a control mode, when the switching element is brought into an ON state, a gate voltage applied to the gate electrode can be controlled based on information including an actual threshold voltage. Accordingly, even when the switching elements 200 are manufactured on a mass production basis, it is unnecessary to measure a threshold voltage of each manufactured switching element before the switching element 200 is connected to the switching element control circuit 102. Accordingly, a measurement operation does not become cumbersome and hence, productivity can be easily enhanced.

Further, according to the switching element control circuit 102 of the embodiment 2, the gate voltage control part 10 controls a gate voltage such that the gate voltage is increased in a step like manner along with a lapse of time in an initial threshold voltage measurement mode. Accordingly, it is possible to measure a threshold voltage of the switching element 200 efficiently and with certainty.

The switching element control circuit 102 according to the embodiment 2 has substantially the same configuration as the switching element control circuit 100 according to the embodiment 1 with respect to points other than the point that the switching element control circuit 102 further includes the threshold voltage measurement power source, the drain current detection part and the ON/OFF state determination part. Accordingly, the switching element control circuit 102 according to the embodiment 2 directly acquires the corresponding advantageous effects found amongst all advantageous effects which the switching element control circuit 100 according to the embodiment 1 acquires.

Embodiment 3

A switching element control circuit according to the embodiment 3 (not shown in the drawing) has basically substantially the same configuration as the switching element control circuit 102 according to the embodiment 2. However, the switching element control circuit according to the embodiment 3 differs from the switching element control circuit 102 according to the embodiment 2 with respect to a point that the switching element control circuit according to the embodiment 3 further includes a temperature characteristic calculation part. That is, the switching element control circuit according to the embodiment 3 is a switching element control circuit which performs a temperature characteristic measurement mode where a temperature characteristic of a threshold voltage of a switching element 200 is measured after a control mode is performed for a predetermined time.

A temperature characteristic calculation part 80 is connected to a temperature detection part 20 and a memory part 30, and calculates a temperature characteristic of a threshold voltage of the switching element.

In the temperature characteristic measurement mode, the following operations are performed.

Figure 8:
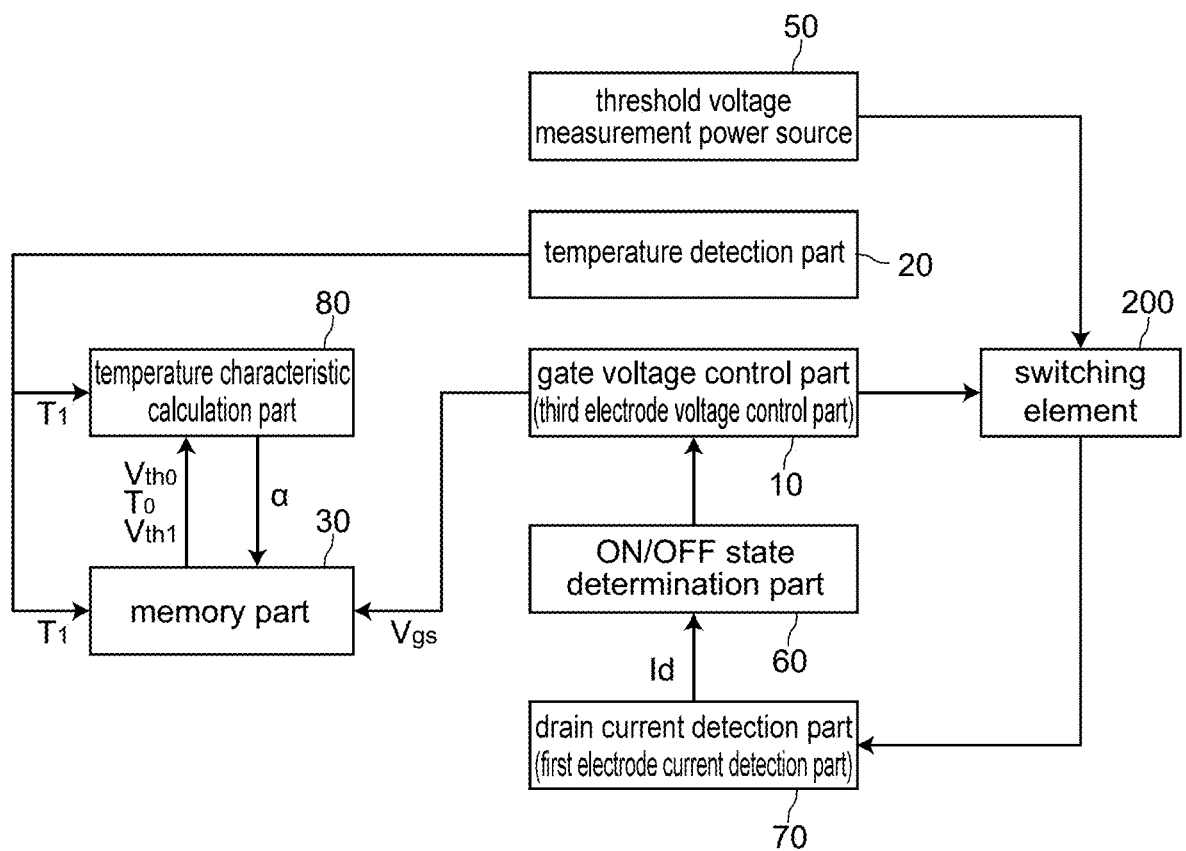
FIG. 8 is a block diagram for explaining a temperature characteristic measurement mode in an embodiment 3.

After the control mode is performed for the predetermined time, an electric current for a threshold voltage measurement is supplied to a drain electrode of the switching element 200 from a threshold voltage measurement power source 50 in a state where an electric current is not supplied from a drive power source 420 (see FIG. 8).

Next, a gate voltage control part 10 controls a gate voltage such that a voltage lower than an estimated threshold voltage (at the time of operating the switching element 200) is applied to the gate electrode. At this stage of operation, a drain current is not detected by a drain current detection part 60 (a value of the drain current being 0) and hence, an ON/OFF state determination part 70 determines that the switching element 200 is in an OFF state. When the ON/OFF state determination part 70 determines that a switching element 200 is in an OFF state, the gate voltage control part 10 controls the gate voltage such that the gate voltage is increased by one stage (see FIG. 7).

The gate voltage is increased in a stepwise manner (to be more specific, increased in a step-like manner) by repeating such an operation. When a drain current is detected by the drain current detection part 60 (when the drain current takes a value other than 0), the ON/OFF state determination part 70 determines that the switching element 200 is in an ON state. At this stage of operation, an operation temperature $T_1$ of the switching element 200 detected by the temperature detection part 20 is transmitted to the memory part 30, and is stored in the memory part 30. Further, the gate voltage control part 10 transmits a gate voltage Vgs applied to the gate electrode to the memory part 30 as a temperature characteristic measurement time threshold voltage $Vth_1$, and the memory part stores the gate voltage Vgs as the temperature characteristic measurement time threshold voltage $Vth_1$.

Next, the temperature characteristic calculation part 80 reads information including an initial threshold voltage $Vth_0$, an initial temperature $T_0$ when the initial threshold voltage $Vth_0$ is measured, and a temperature characteristic measurement time threshold voltage $Vth_1$ of the switching element 200, and also reads an operation temperature $T_1$ of the switching element 200 detected from the temperature detection part 20 in a temperature characteristic measurement mode, and calculates a temperature characteristic (to be more specific, a temperature coefficient α) by putting $Vth=Vth_1$ and $T=T_1$ into a characteristic formula of $Vth=Vth_0-\alpha(T-T_0)$ respectively. The calculated temperature coefficient α is stored in the memory part 30.

In a control mode, a threshold voltage calculation part 40 calculates a threshold voltage Vth based on the temperature coefficient α calculated in the temperature characteristic measurement mode, the operation temperature T of the switching element 200 detected by the temperature detection part 20, an initial threshold voltage $Vth_0$ stored in the memory part 30, and an initial temperature $T_0$ of the switching element 200 when the initial threshold voltage $Vth_0$ is measured, and the threshold voltage calculation part 40 controls a gate voltage based on the threshold voltage Vth.

In this manner, the switching element control circuit according to the embodiment 3 differs from the switching element control circuit 100 according to the embodiment 1 with respect to the point that the switching element control circuit according to the embodiment 3 further includes the temperature characteristic calculation part. However, in the same manner as the switching element control circuit 100 according to the embodiment 1, the threshold voltage calculation part 40 calculates a threshold voltage Vth at the time of operating the switching element 200 based on information including an operation temperature T of the switching element 200 detected by the temperature detection part 20, and the gate voltage control part 10 controls a gate voltage based on the threshold voltage Vth at the time of operating the switching element 200 calculated by the threshold voltage calculation part 40 when the switching element 200 is brought into an ON state. Accordingly, even when the threshold voltage Vth at the time of operating the switching element 200 changes from an initial threshold voltage $Vth_0$ due to the increase of an operation temperature T of the switching element 200 at the time of operating the switching element 200 exceeding an initial temperature $T_0$ of the switching element 200 when the initial threshold voltage $Vth_0$ is measured, it is possible to apply a voltage which slightly exceeds the threshold voltage Vth at the time of operating the switching element 200 to the gate electrode. Accordingly, a turn-on period and a turn-off period can be shortened. As a result, a switching loss can be reduced.

Further, according to the switching element control circuit and a power module of the embodiment 3, the temperature characteristic calculation part calculates a temperature characteristic of a threshold voltage of the switching element based on information including an initial threshold voltage, an initial temperature of the switching element 200 when the initial threshold voltage is measured, an operation temperature of the switching element detected by the temperature detection part in a temperature characteristic measurement mode, and a temperature characteristic measurement time threshold voltage. Accordingly, even when an actual temperature characteristic changes from a temperature characteristic on design due to irregularities in manufacture of the switching element 200, a threshold voltage at the time of operating the switching element can be accurately calculated. Accordingly, a voltage which slightly exceeds the threshold voltage Vth at the time of operating the switching element 200 can be accurately applied to the gate electrode. Accordingly, a turn-on period and a turn-off period can be shortened. As a result, a switching loss can be reduced.

The switching element control circuit according to the embodiment 3 has substantially the same configuration as the switching element control circuit 102 according to the embodiment 2 with respect to points other than the point that the switching element control circuit according to the embodiment 3 further includes the temperature characteristic calculation part. Accordingly, the switching element control circuit according to the embodiment 3 acquires the corresponding advantageous effects found amongst all advantageous effects which the switching element control circuit 102 according to the embodiment 2 acquires.

Although the present invention has been described based on the above-mentioned embodiments, the present invention is not limited to the above-mentioned embodiments. The present invention can be carried out in various modes without departing from the gist of the present invention and, for example, the following modifications are also conceivable.

(1) The numbers and the like of the constitutional elements described in the above-mentioned embodiments are provided for an exemplifying purpose, and can be changed within a scope where advantageous effects of the present invention are not impaired.

(2) In the above-mentioned embodiment 3, the switching element control circuit is a switching element control circuit which performs the initial threshold voltage measurement mode, the temperature characteristic measurement mode, and the control mode. However, the present invention is not limited to such a switching element control circuit. For example, a switching element control circuit which performs only a temperature characteristic measurement mode and a control mode may be adopted. In this case, an initial threshold voltage and an initial temperature are stored in a memory part in advance.

(3) In the above-mentioned respective embodiments, information relating to a temperature characteristic of a threshold voltage of the switching element is expressed by the characteristic formula which satisfies the relationship of $Vth=Vth_0-\alpha(T-T_0)$. However, the present invention is not limited to such information. For example, information relating to a temperature characteristic of a threshold voltage of the switching element may be expressed by another characteristic formula, or may be data which indicates a relationship of temperature-threshold voltage (on one-to-one basis) stored in a memory part in advance.

Figure 9:
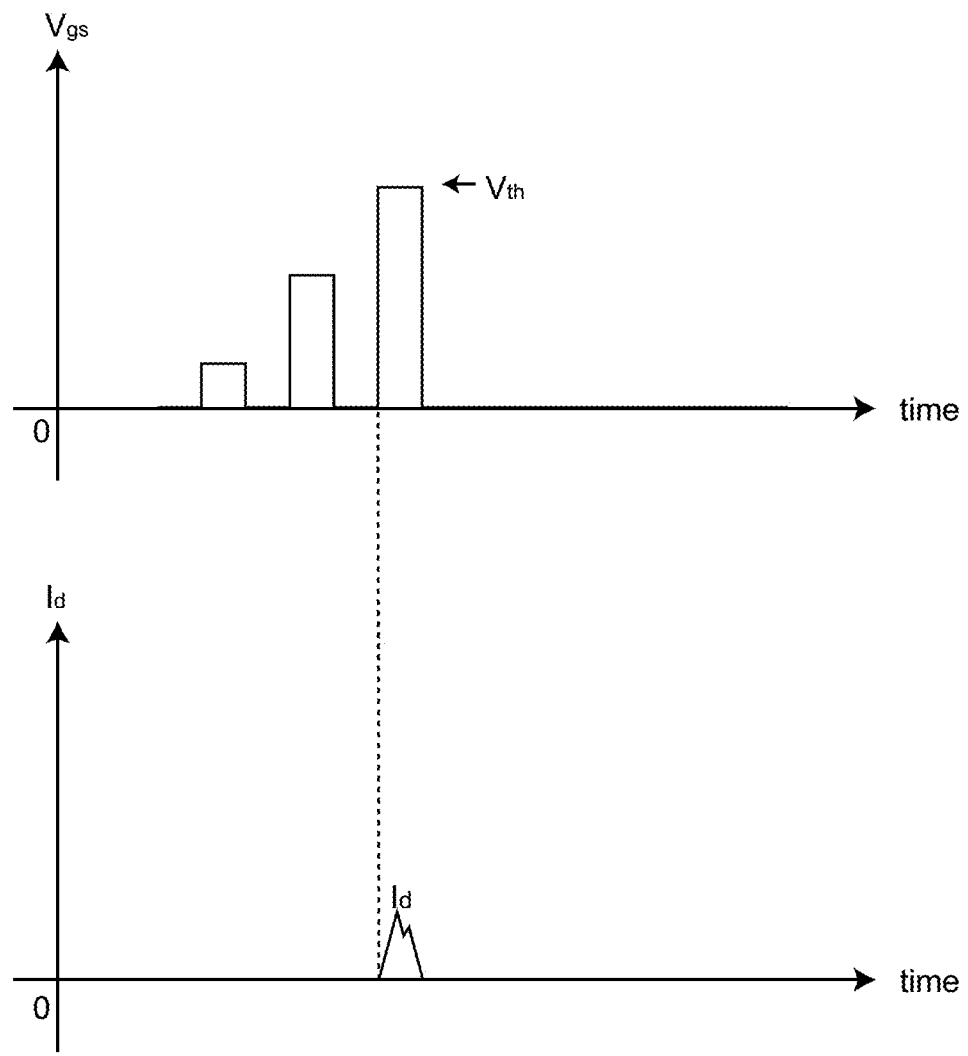
FIG. 9 is a schematic graph for explaining an initial threshold voltage measurement mode (and/or a temperature characteristic measurement mode) according to a modification.
Figure 10:
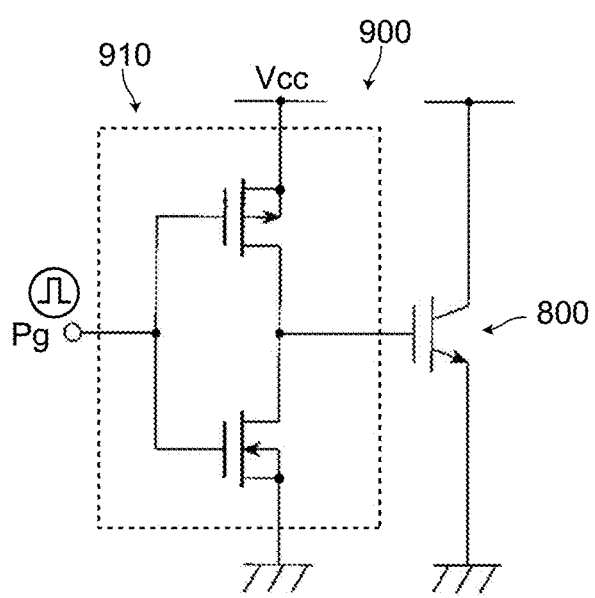
FIG. 10 is a view for explaining a conventional switching element control circuit 900.

(4) In the initial threshold voltage measurement mode in the above-mentioned embodiments 2 and 3, and in the temperature characteristic measurement mode in the embodiment 3, the gate voltage control part 10 controls a gate voltage such that the gate voltage is increased in a step-like manner along with a lapse of time. However, the present invention is not limited to such modes. For example, in the initial threshold voltage measurement mode and the temperature characteristic measurement mode, the gate voltage control part 10 may control a gate voltage such that the gate voltage becomes a pulse-like voltage which is a pulse increasing an amplitude along with a lapse of time (see FIG. 9).

(5) In the above-mentioned respective embodiments, the switching element control circuit controls one switching element. However, the present invention is not limited to such a configuration. The switching element control circuit may control a plurality of switching elements.

(6) In the above-mentioned respective embodiments, the switching element is formed using a material which contains GaN. However, the present invention is not limited to such a configuration. The switching element may be formed using a material which contains a wide-gap semiconductor such as SiC or $Ga_2O_3$ or may be formed using a material which contains silicon.

(7) In the above-mentioned embodiments, a MOSFET is used as the switching element. However, the present invention is not limited to such a configuration. A switching element other than a MOSFET (for example, a HEMT, IGBT or the like) may be used as the switching element.

(8) In the above-mentioned respective embodiments, the switching element control circuit and the switching element may be formed on separate semiconductor substrates or the switching element control circuit and the switching element (for example, a semiconductor element having a lateral structure formed using GaN) are formed on the same semiconductor substrate.

The invention claimed is:

1. A switching element control circuit for controlling an ON/OFF operation of a switching element which includes a first electrode, a second electrode, and a third electrode, the switching element control circuit comprising:
a third electrode voltage control part which controls a third electrode voltage for controlling the ON/OFF operation of the switching element;
a temperature detection part which detects an operation temperature of the switching element;
a memory part which stores information including an initial threshold voltage of the switching element and an initial temperature of the switching element when the initial threshold voltage is measured, and information relating to a temperature characteristic of a threshold voltage of the switching element; and
a threshold voltage calculation part which calculates a threshold voltage at a time of operating the switching element based on information including the operation temperature of the switching element detected by the temperature detection part, the initial threshold voltage, and an initial temperature of the switching element when the initial threshold voltage is measured, and information relating to the temperature characteristic of a threshold voltage of the switching element, wherein
the third electrode voltage control part controls the third electrode voltage based on the threshold voltage at the time of operating the switching element calculated by the threshold voltage calculation part at the time of bringing the switching element into an ON state, and
the information relating to the temperature characteristic of the threshold voltage of the switching element is expressed by a characteristic formula which satisfies a relationship of $Vth = Vth_0 - \alpha(T - T_0)$ assuming that a temperature coefficient of the threshold voltage of the switching element is $\alpha$, the threshold voltage at the time of operating the switching element is $Vth$, the initial threshold voltage is $Vth_0$, the operation temperature of the switching element detected by the temperature detection part is $T$, and the initial temperature of the switching element when the initial threshold voltage is measured is $T_0$.

2. The switching element control circuit according to claim 1, wherein the information including the initial threshold voltage and the initial temperature of the switching element when the initial threshold voltage is measured, and the information relating to the temperature characteristic of the threshold voltage of the switching element are stored in the memory part in advance.

3. The switching element control circuit according to claim 1, wherein the switching element is a MOSFET, IGBT or a HEMT.

4. The switching element control circuit according to claim 1, wherein the switching element is formed using a material which contains GaN, SiC or $Ga_2O_3$.

5. A power module comprising:
a switching element provided with a first electrode, a second electrode, and a third electrode; and
the switching element control circuit according to claim 1 which controls an ON/OFF operation of the switching element.

6. A switching element control circuit for controlling an ON/OFF operation of a switching element which includes a first electrode, a second electrode, and a third electrode, the switching element control circuit comprising:
a third electrode voltage control part which controls a third electrode voltage for controlling the ON/OFF operation of the switching element;
a temperature detection part which detects an operation temperature of the switching element;
a memory part which stores information including an initial threshold voltage of the switching element and an initial temperature of the switching element when the initial threshold voltage is measured, and information relating to a temperature characteristic of a threshold voltage of the switching element; and
a threshold voltage calculation part which calculates a threshold voltage at a time of operating the switching element based on information including the operation temperature of the switching element detected by the temperature detection part, the initial threshold voltage, and an initial temperature of the switching element when the initial threshold voltage is measured, and information relating to the temperature characteristic of a threshold voltage of the switching element, wherein
the third electrode voltage control part controls the third electrode voltage based on the threshold voltage at the time of operating the switching element calculated by the threshold voltage calculation part at the time of bringing the switching element into an ON state,
the switching element control circuit performs an initial threshold voltage measurement mode where the initial threshold voltage of the switching element is measured, and a control mode where an ON/OFF operation of the switching element is controlled,
the switching element control circuit further comprises:
a threshold voltage measurement power source which supplies a threshold voltage measurement current to the first electrode of the switching element;
a first electrode current detection part which detects a first electrode current which flows through the switching element; and
an ON/OFF state determination part which determines an ON/OFF state of the switching element, and
in the initial threshold voltage measurement mode, the third electrode voltage control part controls the third electrode voltage such that the third electrode voltage is increased in a stepwise manner, and the ON/OFF state determination part determines whether or not the switching element is turned on based on the first electrode current detected by the first electrode current detection part, and the memory part stores an operation temperature of the switching element and stores the third electrode voltage applied to the third electrode as the initial threshold voltage of the switching element when the ON/OFF state determination part determines that the switching element is brought into an ON state.

7. The switching element control circuit according to claim 6, wherein the switching element control circuit further performs a temperature characteristic measurement mode where a temperature characteristic of a threshold voltage of the switching element is measured after the control mode is performed for a predetermined time, the switching element control circuit further comprises a temperature characteristic calculation part which calculates a temperature characteristic of a threshold voltage of the switching element, and in the temperature characteristic measurement mode, the third electrode voltage control part controls the third electrode voltage such that the third electrode voltage is increased in a stepwise manner, the ON/OFF state determination part determines whether or not the switching element is turned on based on the first electrode current detected by the first electrode current detection part, the memory part stores an operation temperature of the switching element and stores the third electrode voltage applied to the third electrode as a temperature characteristic measurement time threshold voltage of the switching element when the ON/OFF state determination part determines that the switching element is brought into an ON state, and the temperature characteristic calculation part calculates the temperature characteristic of the threshold voltage of the switching element based on information including the initial threshold voltage, the initial temperature of the switching element when the initial threshold voltage is measured, the operation temperature of the switching element detected by the temperature detection part in the temperature characteristic measurement mode, and the temperature characteristic measurement time threshold voltage.

8. The switching element control circuit according to claim 6, wherein the third electrode voltage control part controls the third electrode voltage such that the third electrode voltage is increased in a stepwise manner along with a lapse of time in the initial threshold voltage measurement mode.

9. The switching element control circuit according to claim 6, wherein the third electrode voltage control part controls the third electrode voltage such that the third electrode voltage becomes a pulse-like voltage which is a pulse increasing an amplitude along with a lapse of time in the initial threshold voltage measurement mode.

10. The switching element control circuit according to claim 6, wherein the switching element is a MOSFET, IGBT or a HEMT.

11. The switching element control circuit according to claim 6, wherein the switching element is formed using a material which contains GaN, SiC or $Ga_2O_3$.

12. A power module comprising:
a switching element provided with a first electrode, a second electrode, and a third electrode; and
the switching element control circuit according to claim 6 which controls an ON/OFF operation of the switching element.

13. A switching element control circuit for controlling an ON/OFF operation of a switching element which includes a first electrode, a second electrode, and a third electrode, the switching element control circuit comprising:
a third electrode voltage control part which controls a third electrode voltage for controlling the ON/OFF operation of the switching element;
a temperature detection part which detects an operation temperature of the switching element;
a memory part which stores information including an initial threshold voltage of the switching element and an initial temperature of the switching element when the initial threshold voltage is measured, and information relating to a temperature characteristic of a threshold voltage of the switching element; and
a threshold voltage calculation part which calculates a threshold voltage at a time of operating the switching element based on information including the operation temperature of the switching element detected by the temperature detection part, the initial threshold voltage, and an initial temperature of the switching element when the initial threshold voltage is measured, and information relating to the temperature characteristic of a threshold voltage of the switching element, wherein
the third electrode voltage control part controls the third electrode voltage based on the threshold voltage at the time of operating the switching element calculated by the threshold voltage calculation part at the time of bringing the switching element into an ON state,
the switching element control circuit performs a temperature characteristic measurement mode where the temperature characteristic of the threshold voltage of the switching element is measured after a control mode where an ON/OFF operation of the switching element is controlled is performed for a predetermined time,
the switching element control circuit further comprises:
a threshold voltage measurement power source which supplies a threshold voltage measurement current to the first electrode of the switching element;
a first electrode current detection part which detects a first electrode current which flows through the switching element;
an ON/OFF state determination part which determines an ON/OFF state of the switching element; and
a temperature characteristic calculation part which calculates a temperature characteristic of a threshold voltage of the switching element, and in the temperature characteristic measurement mode, the third electrode voltage control part controls the third electrode voltage such that the third electrode voltage is increased in a stepwise manner, the ON/OFF state determination part determines whether or not the switching element is turned on based on the first electrode current detected by the first electrode current detection part, the memory part stores the third electrode voltage applied to the third electrode as a temperature characteristic measurement time threshold voltage of the switching element when the ON/OFF state determination part determines that the switching element is brought into an ON state, and the temperature characteristic calculation part calculates the temperature characteristic of a threshold voltage of the switching element based on information including the initial threshold voltage, the initial temperature of the switching element when the initial threshold voltage is measured, the operation temperature of the switching element detected by the temperature detection part in the temperature characteristic measurement mode, and the temperature characteristic measurement time threshold voltage.

14. The switching element control circuit according to claim 13, wherein the third electrode voltage control part controls the third electrode voltage such that the third electrode voltage is increased in a stepwise manner along with a lapse of time in the temperature characteristic measurement mode.

15. The switching element control circuit according to claim 13, wherein the third electrode voltage control part controls the third electrode voltage such that the third electrode voltage becomes a pulse-like voltage which is a pulse increasing an amplitude along with a lapse of time in the temperature characteristic measurement mode.

16. The switching element control circuit according to claim 13, wherein the switching element is a MOSFET, IGBT or a HEMT.

17. The switching element control circuit according to claim 13, wherein the switching element is formed using a material which contains GaN, SiC or $Ga_2O_3$.

18. A power module comprising:
a switching element provided with a first electrode, a second electrode, and a third electrode; and
the switching element control circuit according to claim 13 which controls an ON/OFF operation of the switching element.

* * * * *